(12) United States Patent
Shan et al.

(10) Patent No.: US 6,232,236 B1
(45) Date of Patent: May 15, 2001

(54) APPARATUS AND METHOD FOR CONTROLLING PLASMA UNIFORMITY IN A SEMICONDUCTOR WAFER PROCESSING SYSTEM

(75) Inventors: Hongqing Shan, Cupertino; Claes Bjorkman, Mountain View; Paul Luscher, Sunnyvale, all of CA (US); Richard Mett, Cedarburg, WI (US); Michael Welch, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/365,999

(22) Filed: Aug. 3, 1999

(51) Int. Cl.[7] .................................................. H01L 21/00
(52) U.S. Cl. ........................... 438/715; 156/345; 438/726
(58) Field of Search ....................... 156/345 P, 345 C, 156/345 PT, 345 PW, 345 WH; 216/67; 438/710, 715, 726

(56) References Cited

U.S. PATENT DOCUMENTS

| | | | |
|---|---|---|---|
| 4,464,223 | * 8/1984 | Gorin | 156/345 X |
| 4,859,908 | 8/1989 | Yoshida et al. | 315/111.81 |
| 5,215,619 | 6/1993 | Cheng et al. | 156/345 |
| 5,271,963 | 12/1993 | Eichman et al. | 427/248.1 |
| 5,607,542 | 3/1997 | Wu et al. | 156/643.1 |
| 5,891,350 | 4/1999 | Shan et al. | 216/71 |
| 6,095,084 | * 8/2000 | Shamouilian et al. | 156/345 X |

FOREIGN PATENT DOCUMENTS

| | | |
|---|---|---|
| 0 552 491 A1 | 7/1993 | (EP) . |
| 0 742 577 A2 | 11/1996 | (EP) . |
| 0 776 991 A1 | 6/1997 | (EP) . |
| WO 95/32315 | 11/1995 | (WO) . |

* cited by examiner

Primary Examiner—William Powell
(74) Attorney, Agent, or Firm—Thomason, Moser, Patterso

(57) ABSTRACT

An apparatus and method for controlling a plasma in a plasma processing system. The apparatus comprises a wafer support pedestal surrounded by a process kit that is driven by an RF signal. Both an electrode (cathode) in the pedestal and the process kit are driven with an RF signal to establish a primary plasma above the pedestal and a secondary plasma above the process kit.

32 Claims, 6 Drawing Sheets

APPARATUS AND METHOD FOR CONTROLLING PLASMA UNIFORMITY IN A SEMICONDUCTOR WAFER PROCESSING SYSTEM

BACKGROUND OF THE DISCLOSURE

1. Field of the Invention

The present invention is generally related to semiconductor wafer processing equipment and, more particularly, to an improved apparatus and method for controlling plasma uniformity in a semiconductor wafer processing system.

2. Description of the Related Art

Traditionally, plasma-enhanced reactive ion etching systems contain an anode and cathode within a vacuum chamber. The cathode typically forms a pedestal for supporting a semiconductor wafer within the chamber and the anode is formed of the walls and/or top of the chamber. To process a wafer, a reactive gas is pumped into the vacuum chamber and the anode and cathode are driven by a single sinusoidal frequency (RF) source to excite the reactive gas into a plasma. The single frequency is typically 13.56 MHz, although frequencies from 100 kHz to 2.45 GHz are often used, with the occasional use of other frequencies. More specifically, a single frequency, sinusoidal RF signal is generally applied to the reactive gas within the chamber at a relatively high-power level, e.g., 3 kilowatts. The RF power excites the reactive gas, producing a plasma within the chamber proximate to the semiconductor wafer being processed. Such plasma-enhanced reactive ion processing has been used, for example, in etch and chemical vapor deposition processes.

The uniformity of the etch process that results from the forgoing etch chamber is poor. As such, an improved version of this etch chamber adds four magnetic coils about the outside of the chamber, i.e., one vertically oriented toroidal coil for each side of the chamber. These coils when driven with an AC signal magnetically control the plasma to facilitate a more uniform etch process. This form of chamber is generally known as a magnetically enhanced reactive ion etch (MERIE) chamber. One such MERIE chamber is manufactured by Applied Materials, inc. of Santa Clara Calif. as they model MxP$^+$ chamber. This chamber is described in commonly assigned U.S. Pat. No. 5,215,619 issued Jun. 1, 1993 to Cheng et al. and U.S. Pat. No. 5,891,350 issued Apr. 6, 1999 to Shan et al., which are herein incorporated by reference.

FIG. 1 is a schematic diagram of a MERIE system 100 of the prior art. The system 100 includes a processing chamber 101. The chamber 101 comprises a set of side-walls 102, a floor 104 and a lid 106, defining an enclosed volume. A gas panel 110 supplies reactive gases (an etch chemistry) to the enclosed volume defined by the chamber 101. The system 100 further includes an RF power supply 122 and a matching circuit 120 that drives a pedestal assembly 108 such that an electric field is established between the pedestal assembly 108 and the chamber walls 102 and lid 106. A set of coils 124 are arranged about the sides 102 of the chamber 101 to facilitate magnetic control of the plasma 124.

A pedestal assembly 108 comprises a pedestal 114 centrally mounted within the chamber 101 to a cathode 112 and surrounded by a collar 118. The pedestal retains a workpiece 116 such as a semiconductor wafer which is to be processed in the chamber 101. The plasma reaction chamber 101 employs capacitively coupled RF power to generate and maintain a high density, low energy plasma 124. RF power, is coupled from the RF power supply 122 producing one or more RF frequencies through matching network 120. The lid 106 and walls 102 are grounded and serves as a ground reference (anode) for the RF power. With the configuration shown in FIG. 1, plasma density is controlled by the RF power provided by the power supply 122 via the matching circuit 120.

In semiconductor wafer processing, the cathode 112 is typically fabricated from a conductive material such as aluminum. The pedestal 114 is typically fabricated from a polymer such as polyimide or a ceramic material such as aluminum nitride or boron nitride. The workpiece 116 (i.e., a semiconductor wafer) is typically made of silicon. The electric field that couples to the plasma passes through both the workpiece and the pedestal. Since the cathode is made of a different materials than the workpiece, the different materials have different effects on the plasma. Consequently, there is an abrupt change of plasma parameters, and process uniformity, at the wafer edge 126. To improve process uniformity at the wafer edge, a collar 118, surrounds and partially overlaps the pedestal and pedestal 114. The collar 118 (also known as a process kit) is typically made of a material such as quartz.

Although magnetic enhancement provides a substantial improvement in etch uniformity, the existence of a magnetic field in the chamber causes a phenomenon known as E×B drift where the electrons in the plasma tend to accumulate on one side of the chamber. Such drift causes non-uniform etching. To combat E×B drift, the phase of the AC signal that drives each coil is rotated such that the B field is magnetically rotated. This lessens the E×B drift problem but does not eliminate it. Additionally, non-uniformity of ion energy and radical component density causes non-uniform etching of a wafer.

Therefore, there is a need in the art for an apparatus and method for improved control of the plasma uniformity as well as ion energy and radical component uniformity across the wafer surface to provide for more uniform and repeatable etching of wafers.

SUMMARY OF THE INVENTION

The disadvantages associated with the prior art are overcome by the present invention of an apparatus and method for controlling a uniformity of a plasma, including ion energy uniformity and radical component density within a semiconductor wafer processing system such as an etch reactor. The apparatus comprises a wafer support, a conductive process kit surrounding the wafer support and an RF supply coupled to the process kit. The process kit or collar is biased by an RF signal having a frequency that can be the same as a cathode drive signal or a different frequency. The apparatus establishes a primary plasma in response to the cathode drive signal and a secondary plasma in response to the process kit drive signal. The secondary plasma is established proximate the process kit and, as such, it circumscribes the primary plasma which is located central to the reactor, above the wafer. The secondary plasma supplies electrons to the periphery of the primary such that the primary plasma is substantially uniform over the entire wafer surface. The secondary plasma also facilitates a uniform distribution of ion energy and radical components.

The method and apparatus of the present invention includes a computerized control system for establishing the primary and secondary plasmas with the reactor. The control apparatus also provides for utilizing various waveforms, frequencies and combinations of frequencies to establish and maintain the plasmas such that optimal wafer processing is obtained.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
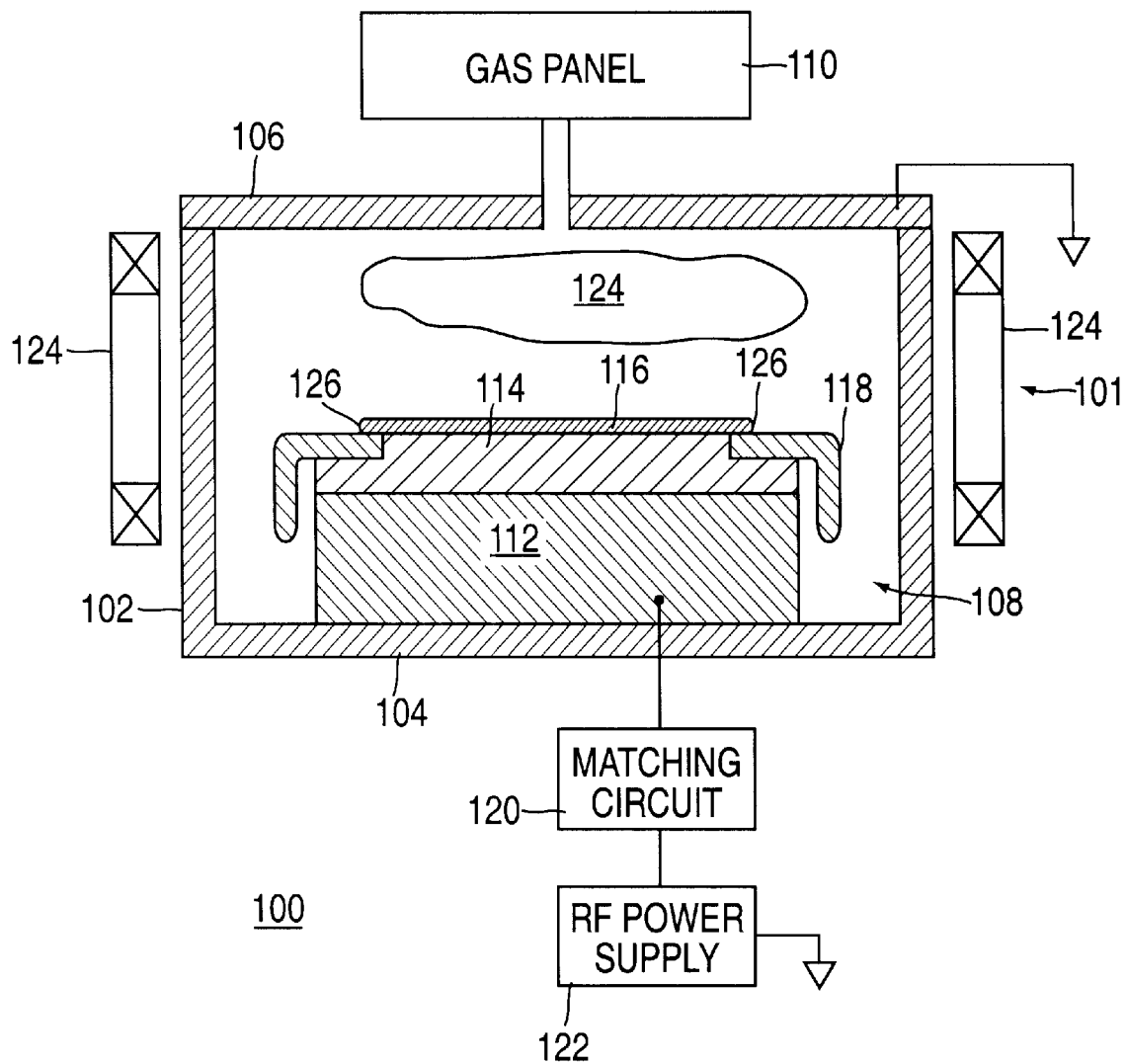
FIG. 1 illustrates a cross sectional schematic view of a semiconductor wafer processing system of the prior art.
Figure 2:
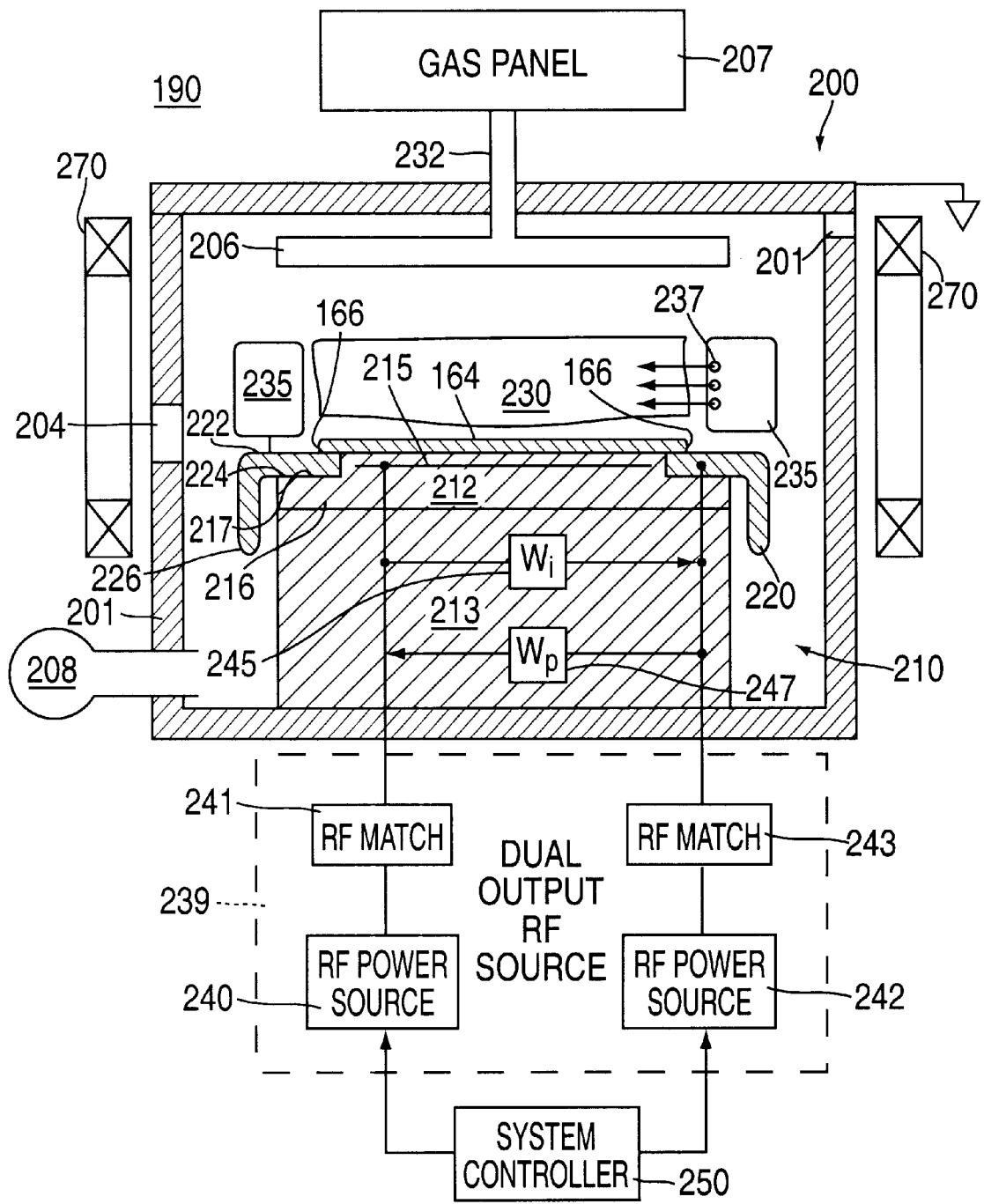
FIG. 2 illustrates a cross sectional schematic view of a semiconductor wafer processing system of a first embodiment of the present invention.

FIG. 2 depicts a first embodiment of the apparatus of the present invention. Specifically, a semiconductor wafer processing system 190 comprising a deposition chamber 200, a wafer support 210, a process kit 220, dual output RF source 239 and a system controller 250.

The chamber 200 comprises a set of side walls 201, a floor 202 and a lid 203. A robot arm (not shown), transfers a wafer 116 in and out of the chamber 200 through a slit valve 204 in the side wall 201. The chamber 200 has showerhead 206 and a gas panel 207 for introducing process gases to the chamber 200. An exhaust system 208 regulates a pressure within the chamber 200. To supply a magnetic field to facilitate plasma control, a plurality of vertically oriented coils 270 are provided adjacent the outside surface of the chamber walls 201. These coils 262 are optional accessories for such a plasma chamber.

The illustrative chamber 200 is a magnetically enhanced reactive ion etch (MERIE) chamber. However, the invention described below can benefit any type of process chamber suitable for performing plasma-based wafer process steps such as etch, physical vapor deposition (PVD), plasma enhanced chemical vapor deposition (PECVD), plasma cleaning and the like. In a preferred embodiment, the plasma process performed by the system 190 is an etch process and the chamber 200 is an eMxP chamber made by Applied Materials, Inc. of Santa Clara, California.

The wafer support 210 comprises an electrostatic chuck 212 (or other wafer retaining apparatus such as a vacuum chuck or mechanical chuck) mounted to a pedestal 213. The pedestal 213 is typically fabricated from a metal such as aluminum. The chuck 212 is typically fabricated from a dielectric material such as a polyimide or ceramic. A workpiece, such as a semiconductor wafer 116, rests on the chuck 212 during processing. The chuck 212 generally includes one or more RF bias electrodes 215. The chuck 212 may also include such components as resistive heaters or electrostatic chuck electrodes (not shown). The latter can be implemented using any number of chucking electrodes and any type of chucking electrode structure including monopolar, bipolar, tripolar, interdigitated, zonal and the like. Similarly, any number or arrangement of heaters can be used including a single heater, or two or more heaters can be used for zoned heating and the like.

The chuck 212 has a radially extending, peripheral flange 216 with an upper surface 217 and an outer edge 218. The flange 216 supports the process kit 220. The process kit 220 is generally annular in shape with top surface 222, a bottom surface 224, a depending extension 226 and an inner edge 228. The process kit is manufactured of a conductive material such as stainless steel. The process kit is supported by the upper surface 217 of the flange 216.

In an etch reactor, the showerhead 206 is typically grounded and serves as an anode. RF power is supplied by the dual output RF source 239 to the bias electrodes 215 within the wafer support 210 to form a cathode. A process gas is coupled from the gas panel 207 via conduit 232 to the chamber 200 via /// the showerhead 206. The process gas may be a single gas or a mixture of multiple gases. To provide the most flexibility, the dual output RF source 239 contains a pair of RF power sources 240 and 242 and their associated matching circuits 241 and 243. The first radio frequency (RF) power supply 240 provides a first RF signal to the bias electrodes 215 through a first matching circuit 241. The first RF signal has a frequency f1. This signal provides power that generates and maintains a primary plasma 230 proximate the wafer 116. Alternatively, a combination of direct current (DC) and RF bias voltage may be applied to the bias electrodes 215 or to the pedestal 213. The first RF signal frequency f1 is typically 13.56 megahertz (MHz), although frequencies from 100 kilohertz kHz to 2.45 gigahertz (GHz) are often used, with the occasional use of other frequencies.

In the primary plasma 230, a portion of the process gas molecules are dissociated to form ions. Electric fields from the RF signal accelerate the ions toward the wafer 116. The ions bombard the wafer 116 thereby etching the top surface of the wafer 116. Etching may be enhanced by a chemical reaction between the ions and the wafer 116. The etch rate is controlled by plasma parameters such as the density of ions in the primary plasma 230 and the energy of ions bombarding the wafer 116. To uniformly etch the wafer, the ion density and ion energy must be uniform across the wafer 116 between a center 164 and an edge 166. To magnetically enhance the plasma, a low frequency AC signal (e.g., 60 Hz) having rotating phase is optionally supplied to the magnets 270 such that a plasma stirring effect is created.

In a first embodiment of the present invention that facilitates further plasma uniformity, a second RF power supply 242 is coupled to the process kit 220 through a second matching circuit 243. The second power supply 242 provides a second RF signal, having a frequency f2, to the process kit 220. The second RF signal provides power to the process kit 220 that sustains a secondary plasma 235 proximate the top surface 222 of the process kit 220. The secondary plasma 235 provides electrons 237 to the primary plasma 230 proximate the wafer edge 166. Interaction between the electrons 237 and the plasma 230 produces additional ions. Thus, the supply of electrons 237 regulates the ion density and/or ion energy in the primary plasma 230 proximate the wafer edge 166. As such, ion energy and the density of radical components can be controlled and made more uniform. The supply of electrons 237 can be controlled by adjusting the power provided to the process kit 220. Thus, the second RF power supply 242 provides an additional control over uniformity of the plasma 230 between the center 164 and the edge 166 of the wafer 116. The second signal frequency f2 may be between 100 kHz and 2.45 GHz. Preferably, the second RF signal frequency f2 is 400 kHz.

Alternatively, a portion of the signal produced by the first RF power supply 240 can be coupled to the process kit 220. Similarly, a portion of the signal produced by the second RF power supply 242 is coupled to the pedestal 213. The magnitude of the cross-coupled signals are selected by the weighing values in the attenuators or amplifiers 245 and 247.

Figure 3:
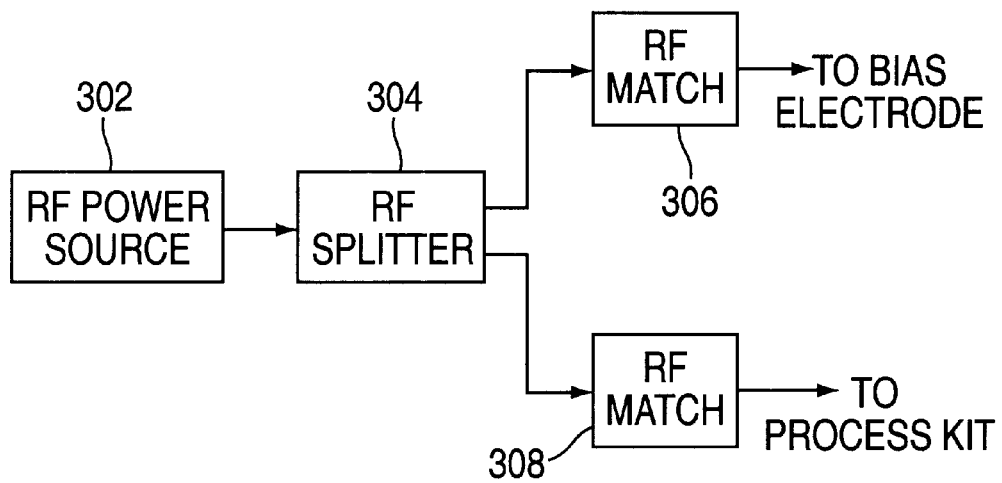
FIG. 3 illustrates a cross sectional view of an apparatus of a second embodiment of the present invention.

A second embodiment of the invention, depicted in FIG. 3, utilizes a dual output RF source 239 having only a single RF power source 302 that is coupled to an RF power splitter 304. The two output signals from the splitter 304 are coupled to first and second matching networks 306 and 308. The wafer support bias electrode 215 is coupled to the first matching circuit 306, while the process kit 220 is coupled to the second matching circuit 308. Power delivered to the wafer support electrode 215 drives a primary plasma and power delivered to the process kit 220 drives a secondary plasma in a manner analogous to that described with respect to FIG. 2. In this embodiment, the RE power supply 302 provides a signal having a single frequency to both the wafer support and the process kit. The frequency of the signal is typically 100 kHz to 2.45 GHZ. However, as discussed below, the RF power source 302 could provide a broad band signal that encompasses a broad spectrum of frequencies and the match circuits would selectively respective couple sub-bands of the signal to the process kit and bias electrode.

More specifically, the RF power supply 302 may be a complex waveform generator coupled to a high-power amplifier. The matching networks 306 and 308 select particular frequencies (or bands of frequencies) of RF power to be coupled to the wafer support and process kit. Thus signals having different frequencies may be supplied to the wafer support and process kit. Complex waveform generators produce waveforms of any form using a Fourier waveform analysis technique. Alternatively, the complex waveform generator may be a digital waveform generator which produces digitally synthesized waveforms. Such complex waveform generators are widely available in the signal processing arts. Using such waveform generators facilitates optimal tailoring of the excitation waveform to the chamber environment and plasma load impedance. The use of such a waveform generator is described in the commonly assigned U.S. patent application Ser. No. 08/991,749, filed Dec. 16, 1997, entitled "Apparatus for Exciting a Plasma in a Semiconductor Wafer Processing System Using a Complex RF Waveform", incorporated herein by reference.

In a third embodiment of the invention, a chuck 400 is provided with separate bias electrodes for powering primary and secondary plasmas for processing a wafer 116. The chuck 400, schematically depicted in FIG. 4, comprises a dielectric body 402 with a central electrode 404 disposed within the body 402. An annular peripheral electrode 406 is disposed within the body 402 proximate the periphery of the chuck 400. The body 402 includes a peripheral flange 408 that supports a process kit 220. The dual output RF power source 239 provides a first RF signal to the central electrode 404 and a second RF signal to the peripheral electrode 406. The second RF signal is capacitively coupled to the process kit 220 via the peripheral electrode 406. As such, a secondary plasma is established above the process kit 220. The second RF signal may be produced in any of the ways that have previously been discussed.

Figure 7:
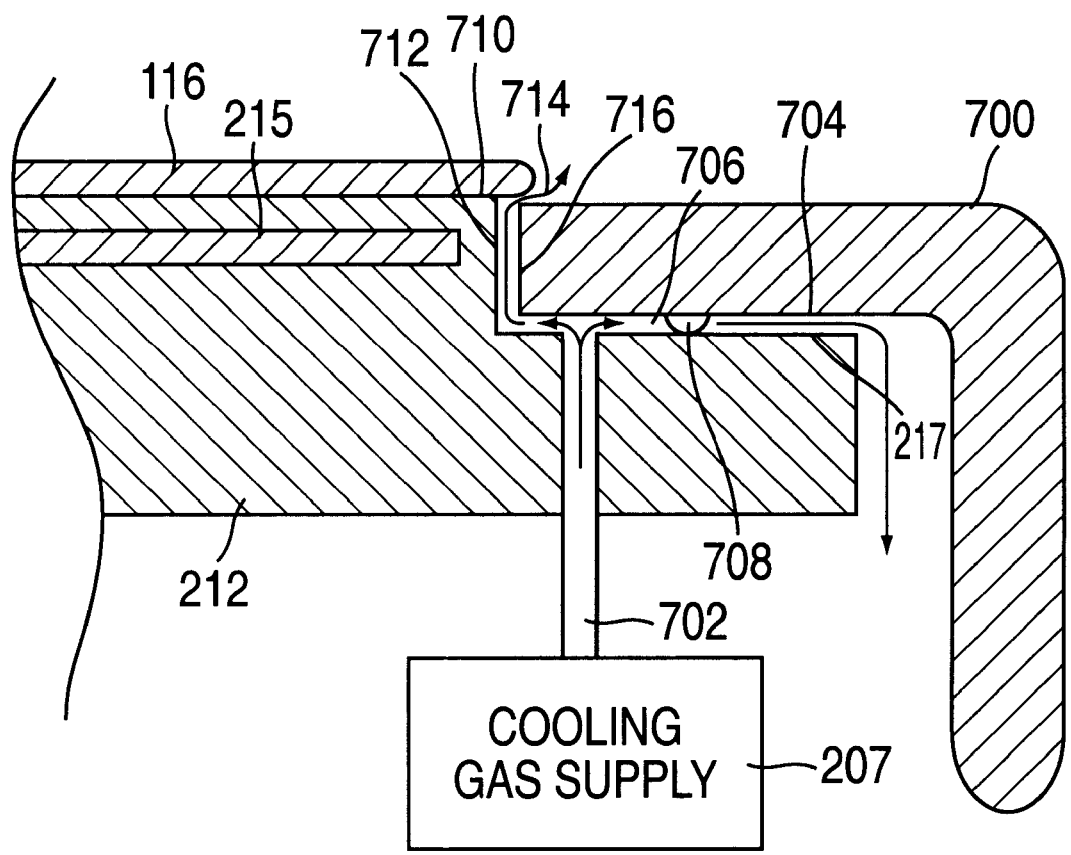
FIG. 7 depicts a detailed cross-sectional view of a process kit that defines cooling gas passageways such that a heat transfer medium can be applied to the process kit to control the temperature of the process kit.

Since the rate of reactions affecting the uniformity of the plasma is partly controlled by the temperature of the process kit, additional control over the plasma uniformity may be achieved by controlling a temperature of the process kit. FIG. 7 depicts a detailed cross-sectional view of an improved process kit 700 for the chamber 200 of FIG. 2. The temperature of the process kit 700 may be controlled, for example, by flowing a heat transfer medium such as an inert gas (e.g., helium or argon) from the gas panel 207 through the pathway 302 to the underside surface 304 of the process kit 700. The underside surface 704 is spaced apart from the surface 217 of the chuck 212 to form a gap 706 through which the gas may flow. The gap 706 is maintained by a plurality of protrusions 708 extending from the underside surface 702 of the process kit 300. Additionally, the process kit is sized to have an inner diameter that is slightly larger than the outer diameter of the wafer support surface 710 of the chuck 212 such that a gap 716 is formed between the peripheral surface 712 of the wafer support surface 710 and the inner surface 716 of the process kit 700. As such, the heat transfer medium that is coupled to gap 706 is also coupled to gap 712 to provide further heat transfer form the process kit 700.

Figure 5:
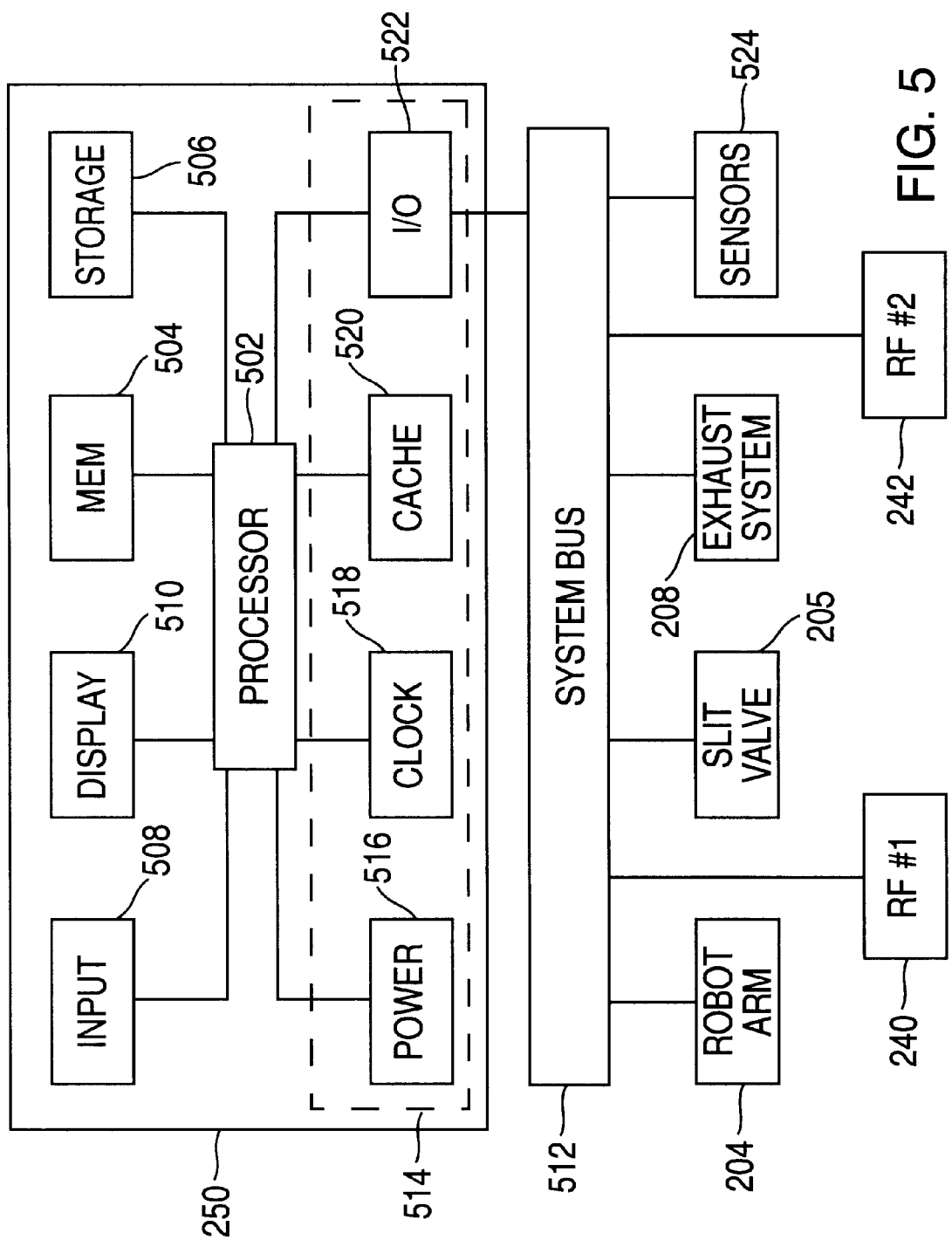
FIG. 5 illustrates a system block diagram of a semiconductor wafer processing system of the present invention.

The above-described apparatus can be employed in a plasma processing system that is controlled by a processor based system controller. For example, FIG. 5 shows a block diagram of the plasma processing system 190 depicted in FIG. 2, wherein the system controller 250 is employed in such a capacity. The system controller unit 250 includes a programmable central processing unit (CPU) 502 that is operable with a memory 504, a mass storage device 506, an input control unit 508, and a display unit 510. The system controller further includes well-known support circuits 514 such as power supplies 516, clocks 518, cache 520, input/output (I/O) circuits 522 and the like. The controller 250 also includes hardware for monitoring wafer processing through sensors 524 in the chamber 200. The sensors 524 measure system parameters such as wafer temperature, chamber atmosphere pressure, plasma temperature, plasma voltage and plasma current. All of the above elements are coupled to a control system bus 512.

The memory 504 contains instructions that the processor unit 502 executes to facilitate the performance of the wafer processing system 190. The instructions in the memory 504 are in the form of program code. The program code may conform to any one of a number of different programming languages. For example, the program code can be written in C+, C++, BASIC, Pascal, or a number of other languages.

The mass storage device 506 stores data and instructions and retrieves data and program code instructions from a processor readable storage medium, such as a magnetic disk or magnetic tape. For example, the mass storage device 506 can be a hard disk drive, floppy disk drive, tape drive, or optical disk drive. The mass storage device 506 stores and retrieves the instructions in response to directions that it receives from the processor unit 502. Data and program code instructions that are stored and retrieved by the mass storage device 506 are employed by the processor unit 502 for operating the plasma processing system 190. The data and program code instructions are first retrieved by the mass storage device 506 from a medium and then transferred to the memory 504 for use by the processor unit 502.

The input control unit 508 couples a data input device, such as a keyboard, mouse, or light pen, to the processor unit 502 to provide for the receipt of a chamber operator's inputs. The display unit 510 provides information to a chamber operator in the form of graphical displays and alphanumeric characters under control of the processor unit 502.

The control system bus 512 provides for the transfer of data and control signals between all of the devices that are coupled to the control system bus 512. Although the control system bus is displayed as a single bus that directly connects the devices in the processor unit 502, the control system bus 512 can also be a collection of busses. For example, the display unit 510, input control unit 508 and mass storage device 506 can be coupled to an input-output peripheral bus, while the processor unit 502 and memory 504 are coupled to a local processor bus. The local processor bus and input-output peripheral bus are coupled together to form the control system bus 512.

The system controller 250 is coupled to the elements of the deposition system 190, employed in plasma processing in accordance with the present invention via the system bus 512 and the I/O circuits 522. These elements include the following: the robot arm 204, the slit valve 205, the gas panel 207, the exhaust system 208, the sensors 524 and the RF power supplies 240 and 242. The system controller 250 provides signals to the chamber elements that cause these elements to perform operations for processing a semiconductor wafer in the subject apparatus.

Figure 6:
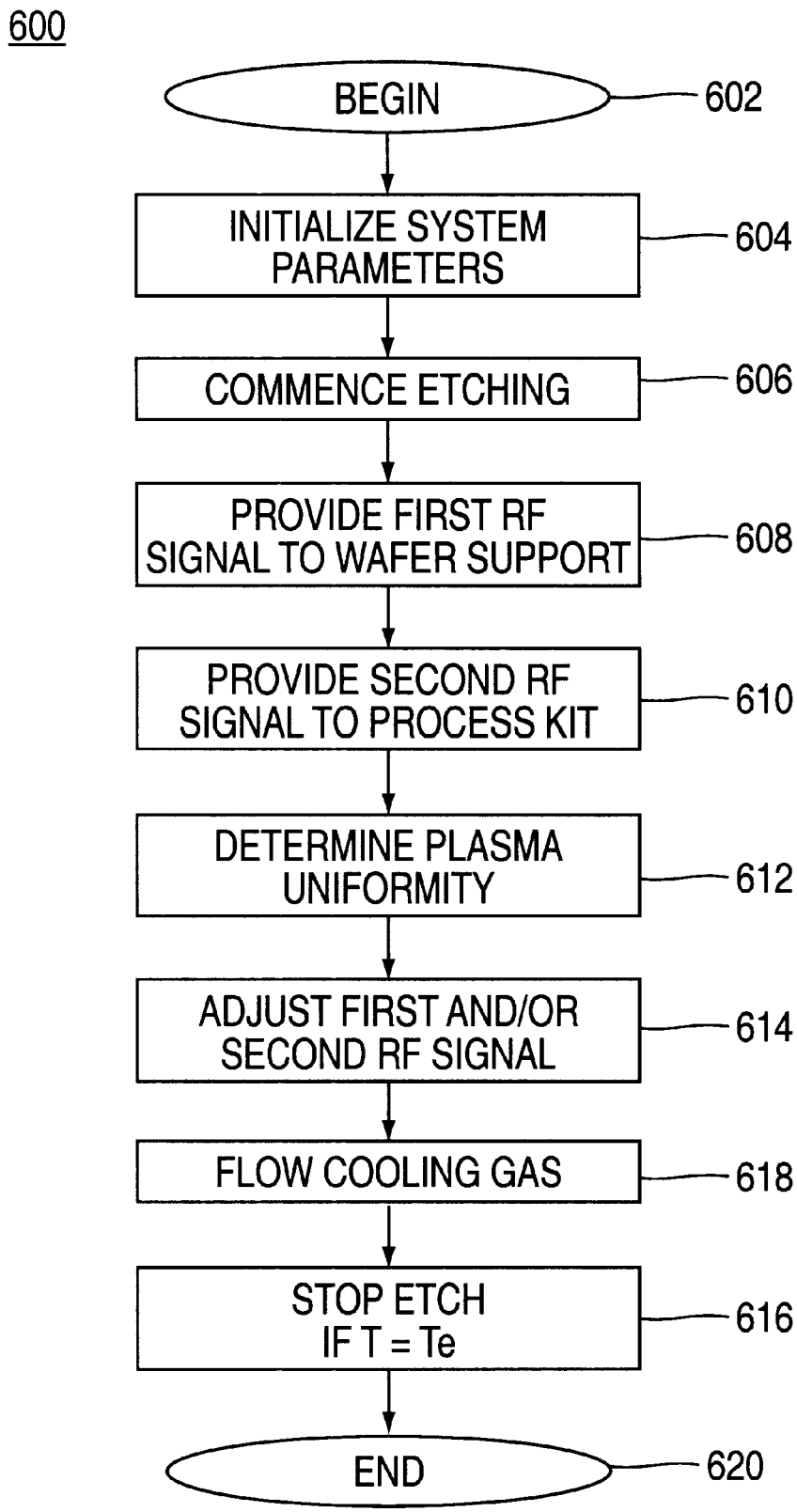
FIG. 6 illustrates a flow diagram for a plasma processing method of the present invention.

An improved method for plasma processing is also described as part of the subject invention. Those skilled in the art would be readily able to devise a computer program such as a program 600 depicted in the flow diagram of FIG. 6. The program 600 is suitable for monitoring and controlling a plasma process. Although the program 600 is described herein with respect to an etch process, those skilled in the art will recognize that the method of the present invention can be applied to any plasma enhanced wafer process.

The program begins at step 602. System operating parameters are established in step 604. In operation, the processor unit 502 directs the operation of the chamber elements in response to the program code instructions that it retrieves from the memory 504. For example, once a wafer 116 is placed in the processing chamber 200, the processor unit 502 executes instructions retrieved from the memory 504 such as activating the robot arm to insert the wafer 116 into the chamber 200 and place it on the chuck 212, controlling the gas panel 207 to permit the flow of process gas, moving chuck 212 (if applicable) into position for processing and the like. Process parameters such as frequencies f1 and f2, process gas flow rates, chamber pressure and etch duration $T_e$ are initialized at this time. These values can be part of the code of program 600, or entered by an operator at the input control unit 508, or otherwise retrieved from the memory 504 or the mass storage device 506.

Etching commences at step 606. For example, the processor unit 502 executes instructions directing the gas panel 207 to permit the flow of process gas. The program may also direct the exhaust system 208 to control the atmosphere pressure in the chamber 200. At step 608, the processor unit 502 instructs dual output RF source 239 to apply power to the chamber 200. For example, the first power supply 240 to provide a first RF signal having a frequency f1 to the wafer support (i.e., to bias electrode 215). Energy from the first RF signal ignites and sustains the primary plasma 230 as described above with respect to FIG. 2. In step 610, the processor unit 502 instructs the second power supply 242 to provide a second RF signal having a frequency f1 to the process kit 220 thus producing the secondary plasma 235 as described above with respect to FIG. 2. Once etching commences, the program 600 keeps track of elapsed time T by, for example, referring to a signal from the clock 518.

During processing, the program 600 executes instructions for optimizing the plasma uniformity. For example, in step 612, the program 600 executes instructions for determining plasma uniformity based on signals from the sensors 524. In step 614, the program 600 optimizes process uniformity by adjusting the power level and/or frequency delivered by power supplies 240 and 242. Additionally, the program further optimizes plasma uniformity by controlling the temperature of the process kit 220. For example, in step 616, the program executes a set of instructions to direct the gas panel 207 to flow the cooling gas 260 between the chuck 212 and the process kit 220 as described above with respect to FIG. 7.

Once the elapsed time T equals the predetermined etch duration $T_e$, etching stops at step 618. The etch process can also be stopped using an etch end point detection system. For example, the program 600 may execute a set of instructions that signal the power supplies 240 and 242 to turn off. The program then ends at step 620. The execution of these instructions results in the elements of the semiconductor processing system 190 being operated to etch material on the surface of a substrate.

Figure 4:
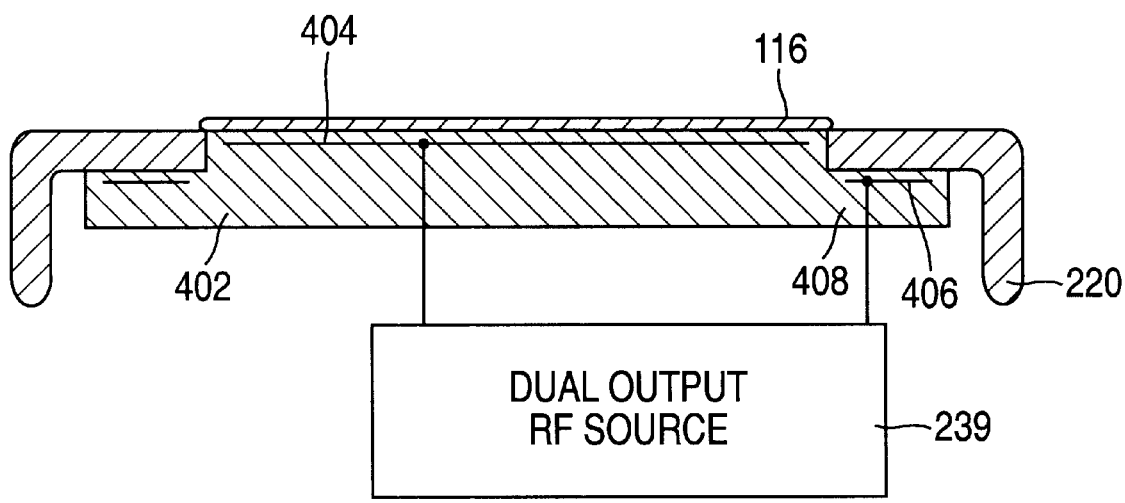
FIG. 4 illustrates a cross sectional view of an apparatus of a third embodiment of the present invention.

Those skilled in the art will realize that such a method may be readily adapted to use with apparatus such as that depicted in FIG. 3 or 4. For example, the respective matching circuits 306 and 308 control the power levels transmitted to the wafer support 310 and process kit 320. Such matching circuits may be coupled to the processor and the two power levels controlled by program similar to the program 600.

Although various embodiments which incorporate the teachings of the present invention have been shown and described in detail herein, those skilled in the art can readily devise many other varied embodiments that still incorporate these teachings.

What is claimed is:

1. Apparatus for controlling a plasma in a plasma processing system, comprising:

a wafer support pedestal;

a process kit surrounding said wafer support pedestal; and an RF power supply coupled to said process kit.

2. The apparatus of claim 1 wherein said RF power supply is also coupled to said wafer support pedestal.

3. The apparatus of claim 1 further comprising a second RF power supply coupled to said wafer support pedestal.

4. The apparatus of claim 1 wherein said wafer support pedestal contains a chuck with a peripheral flange, said process kit is supported by said flange.

5. The apparatus of claim 4 wherein said process kit is supported in a spaced apart relationship with respect to said flange to form a gap therebetween.

6. The apparatus of claim 5 further comprising a cooling gas source coupled to said gap.

7. The apparatus of claim 1 wherein the wafer support pedestal comprises an annular electrode that is located beneath the process kit and said RF power supply is coupled to said annular electrode.

8. A plasma processing system comprising:

a chamber;

a wafer support pedestal disposed within said chamber;

a process kit surrounding said wafer support pedestal; and an RF power supply coupled to said process kit.

9. The system of claim 8 wherein said RF power supply is also coupled to said wafer support pedestal.

10. The system of claim 8 further comprising a second RF power supply coupled to said wafer support pedestal.

11. The system of claim 9 wherein said RF power supply provides a signal having a first frequency to said wafer support and a second signal having a second frequency to said process kit.

12. The system of claim 9 wherein said first and second frequencies are different.

13. The system of claim 11 wherein said process kit is supported in a spaced apart relationship with respect to said wafer support whereby a gap is formed therebetween.

14. The system of claim 12 wherein said gap defines a pathway for a cooling gas.

15. The system of claim 13 further comprising a cooling gas source that supplies said cooling gas to said gap.

16. The apparatus of claim 8 wherein the wafer support pedestal comprises an annular electrode that is located beneath the process kit and said RF power supply is coupled to said annular electrode.

17. In a semiconductor wafer processing system, having a chamber containing a gas, a wafer support pedestal, a process kit and an RF power supply, a method for controlling a plasma uniformity comprising the steps of:

(a) supplying a first RF signal to the wafer support pedestal to produce a primary plasma; and (b) supplying a second RF signal to the process kit to produce a secondary plasma.

18. The method of claim 17 wherein said first and second RF signals have the same frequency.

19. The method of claim 17 wherein said first and second RF signals have different frequencies.

20. The method of claim 19 wherein said first frequency is approximately 400 KHz to 200 MHz.

21. The method of claim 19 said second frequency is approximately 400 kHz to 60 MHz.

22. The method of claim 17 further comprising the step of c) controlling a temperature of said process kit.

23. A computer readable storage medium having program code embodied therein, said program code, when executed by a computer, for controlling a plasma in a semiconductor processing system having a chamber containing a gas, a wafer support pedestal, a process kit and an RF power supply, said program code controlling the semiconductor processing system in accordance with the following steps:

(a) supplying a first RF signal to the wafer support to produce a primary plasma; and (b) supplying a second RF signal to the process kit to produce a secondary plasma.

24. The computer readable storage medium of claim 23 wherein said first and second RF signals have the same frequency.

25. The computer readable storage medium of claim 23 wherein said first and second RF signals have different frequencies.

26. The computer readable storage medium of claim 24 wherein said first frequency is approximately 400 kHz to 200 MHz.

27. The computer readable storage medium of claim 24 wherein said second frequency is approximately 400 kHz to 60 MHz.

28. The computer readable storage medium of claim 24 wherein said program comprises the further step of controlling a temperature of said process kit.

29. Apparatus for supporting a semiconductor wafer, comprising:

a wafer support having a periphery;

a cathode electrode disposed centrally with respect to said wafer support; and a secondary electrode, disposed within said wafer support, adjacent said periphery.

30. The apparatus of claim 29 wherein said wafer support is adapted to receive a process kit that surrounds said periphery.

31. The apparatus of claim 30 wherein said wafer support has a peripheral flange.

32. The apparatus of claim 30 wherein said electrode is situated proximate said peripheral flange beneath said process kit.

* * * * *